(12) United States Patent
Jung (10) Patent No.: US 7,253,037 B2
(45) Date of Patent: Aug. 7, 2007

(54) METHOD OF FABRICATING THIN FILM TRANSISTOR

(75) Inventor: In-Young Jung, Suwon (KR)

(73) Assignee: Samsung SDI Co., Ltd., Suwon-si (KR)

( * ) Notice: Subject to any disclaimer, the term of this patent is extended or adjusted under 35 U.S.C. 154(b) by 0 days.

(21) Appl. No.: 11/206,923

(22) Filed: Aug. 17, 2005

(65) Prior Publication Data
US 2006/0046360 A1    Mar. 2, 2006

(30) Foreign Application Priority Data
Aug. 25, 2004  (KR) ............ 10-2004-0067299

(51) Int. Cl.
*H01L 21/00* (2006.01)
(52) U.S. Cl. ............ 438/149; 438/166; 257/E21.421
(58) Field of Classification Search ........... 438/149, 438/166; 257/E21.421
See application file for complete search history.

(56) References Cited

U.S. PATENT DOCUMENTS 6,297,080 B1 * 10/2001 Lee et al. ............ 438/151
6,482,721 B1 * 11/2002 Lee ..................... 438/486
6,500,736 B2 * 12/2002 Kim et al. ............ 438/486
6,541,323 B2 * 4/2003 Yang et al. ........... 438/200
6,607,949 B2 * 8/2003 Kim et al. ............ 438/166
6,849,525 B2 * 2/2005 Kim et al. ............ 438/486

FOREIGN PATENT DOCUMENTS

KR    2000-0031708    6/2000

OTHER PUBLICATIONS

Patent Abstracts of Korea for Publication No. 1020000031708 A; Date of publication of application Jun. 5, 2000, in the name of Jae Beom Choi et al.

* cited by examiner

*Primary Examiner*—Trung Dang
(74) *Attorney, Agent, or Firm*—Christie, Parker & Hale, LLP

(57) ABSTRACT

A method of fabricating a thin film transistor is provided. The method comprises first preparing a substrate and forming an amorphous silicon layer on the substrate. A catalyst construction is then positioned on the amorphous silicon layer and an anode and a cathode are then connected to the catalyst construction. A predetermined amount of electric power is then delivered to the anode and the cathode, generating joule heat which then crystallizes the portion of the amorphous silicon layer on which the catalyst construction is positioned, thereby forming a polysilicon layer. The remaining portion of the amorphous silicon layer is then crystallized to a polysilicon layer by propagating the crystallization of the portions of the polysilicon layer on which the catalyst construction is positioned.

19 Claims, 11 Drawing Sheets

METHOD OF FABRICATING THIN FILM TRANSISTOR

CROSS-REFERENCE TO RELATED APPLICATION

This application claims priority to and the benefit of Korean Patent Application No. 2004-67299, filed Aug. 25, 2004 in the Korean Intellectual Property Office, the entire content of which is incorporated herein by reference.

FIELD OF THE INVENTION

The present invention relates to a method of fabricating a thin film transistor. More particularly, the method comprises first forming a catalyst construction on an amorphous silicon layer. Electric power is then applied to the catalyst construction to generate joule heat. The joule heat induces crystallization of a portion of the amorphous silicon layer on which the catalyst construction is positioned, thereby creating a polysilicon layer. The remainder of the amorphous silicon layer is then crystallized by propagating the crystallization of the portion of the polysilicon layer on which the catalyst construction is positioned, thereby forming a polysilicon layer over the entire substrate.

BACKGROUND OF THE INVENTION

Flat panel display devices, such as liquid crystal displays (LCD), organic electroluminescent displays (OELD) and plasma display panels (PDP) have attracted public attention as good alternatives to conventional display devices such as heavy and bulky cathode ray tube (CRT) devices.

Thin film transistors (TFT) used in flat panel displays require high speed operation in response to given signals and uniformity over the entire substrate. To create TFTs having these characteristics, it is very important to control the characteristics of the TFT semiconductor layer.

Techniques used to crystallize an amorphous silicon layer to form a polysilicon layer typically include solid phase crystallization, excimer laser crystallization, metal induced crystallization (MIC), and metal induced lateral crystallization (MILC). Solid phase crystallization involves heat-treating and crystallizing an amorphous silicon layer for several hours to tens of hours at the glass transition temperature, i.e. at a temperature of less than about 700° C. This process creates a substrate on which a TFT is formed. Excimer laser crystallization involves scanning an amorphous silicon layer with an excimer laser and heating the amorphous silicon layer at a high temperature for a very short period of time to crystallize the amorphous silicon layer.

Solid phase crystallization is disadvantageous because the substrate is exposed to a high temperature for a long period of time and may therefore be easily damaged. Excimer laser crystallization is also disadvantageous because the required excimer laser and maintenance fees are expensive. MIC and MILC are also disadvantageous because both processes require a long period of time to crystallize the polysilicon layer.

SUMMARY OF THE INVENTION

In one embodiment of the present invention, a method of fabricating a thin film transistor comprises first forming a catalyst construction on an amorphous silicon layer, and then applying electric power to the catalyst construction to generate joule heat. The joule heat induces crystallization of the portion of the amorphous silicon layer on which the catalyst construction is positioned, thereby forming a polysilicon layer. The remaining portion of the amorphous silicon layer is then crystallized by propagation, thereby forming a polysilicon layer over the entire substrate.

According to one embodiment of the present invention, the method of fabricating a thin film transistor comprises first preparing a substrate and forming an amorphous silicon layer on the substrate. A catalyst construction is then formed on the amorphous silicon layer, and an anode and a cathode are attached to the catalyst construction. Electric power is then applied to the anode and the cathode, catalyst construction. The joule heat induces crystallization of the portion of the amorphous silicon layer on which the catalyst construction is positioned, thereby forming a polysilicon layer. The remaining portion of the amorphous silicon layer is then crystallized by propagation to form a polysilicon layer.

BRIEF DESCRIPTION OF THE DRAWINGS

The above and other features and advantages of the present invention will become more apparent by reference to the following detailed description when considered in conjunction with the accompanying drawings in which.

DETAILED DESCRIPTION

Exemplary embodiments of the present invention will now be described in detail with reference to the accompanying drawings. However, one of ordinary skill in the art understands that various modifications may be made to the described embodiments, and that the invention is not limited to the described embodiments. Rather, the embodiments are described for illustrative purposes only. Also, the drawings are not to scale and certain components are exaggerated for clarity. In addition, like reference numerals are used to identify like components.

Figure 1:
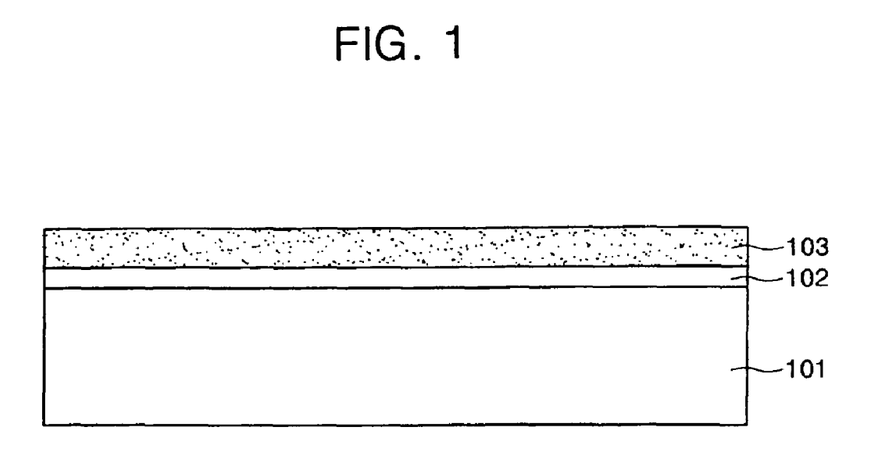
FIG. 1 is a cross-sectional view of substrate according to one embodiment of the present invention, illustrating a first step in a method of fabricating a thin film transistor according to one embodiment of the present invention.

FIGS. 1 through 5B illustrate various steps in a method of fabricating a thin film transistor (TFT) according to one embodiment of the present invention. FIG. 1 is a cross-sectional view of a substrate and illustrates a first step in the method. As shown in FIG. 1, a buffer layer 102 and an amorphous silicon layer 103 are positioned on a substrate 101. The buffer layer 102 may comprise a single layer or multiple layers and is formed on the substrate 101, which may comprise any suitable material, such as glass or plastic. The buffer layer 101 may comprise any suitable material, such as silicon oxide or silicon nitride. The buffer layer 102 prevents impurities, such as gas, in the substrate 101 from reaching other layers.

The amorphous silicon layer 103 is deposited on the buffer layer 102 by any suitable technique, for example by chemical vapor deposition (CVD) or physical vapor deposition (PVD). The amorphous silicon 103 layer contains gas, such as hydrogen, which may cause the layer 103 to crack, adversely affecting the characteristics of the crystallized polysilicon layer. To prevent cracking, the gas is removed from the amorphous silicon layer 103 by dehydrogenation.

Figure 2:
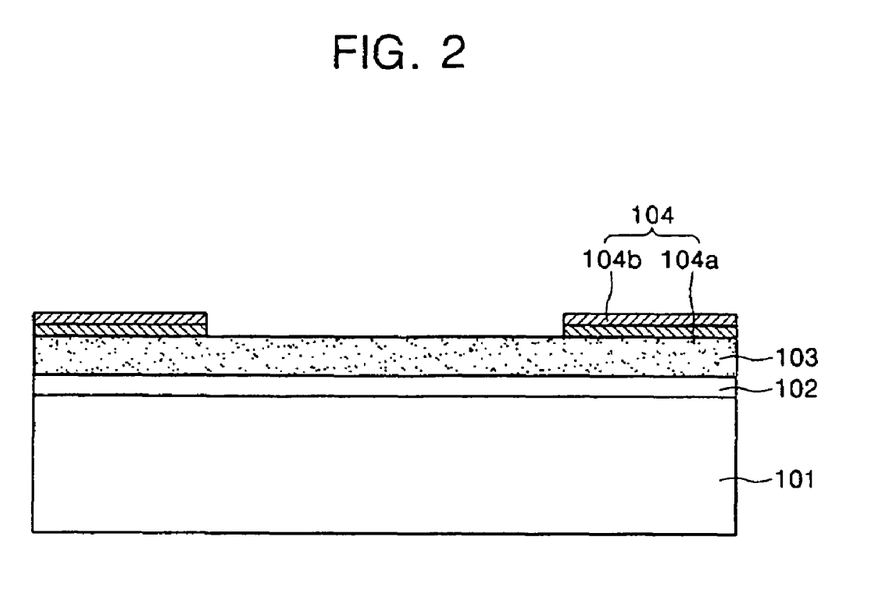
FIG. 2 is a cross-sectional view of the substrate of FIG. 1, illustrating a second step in the method of fabricating a thin film transistor.

FIG. 2 is a cross-sectional view of a substrate and illustrates a second step in the method for fabricating the thin film transistor. As shown in FIG. 2, a catalyst layer 104a is positioned on at least one region of the amorphous silicon layer 103. The catalyst layer 104a has a thickness of about 10 to about 100Å. A joule heat layer 104b is deposited on the catalyst layer 104a. The catalyst layer 104a and the joule heat layer 104b are connected to form a catalyst construction 104. The joule heat layer 104b generates joule heat by application of electric power to the catalyst construction 104. The catalyst layer 104a comprises a metal selected from the group consisting of Ni, Pd, Ti, Ag, Au, Al, Sn, Sb, Cu, Co, Mo, Cr, Ru, Rh, Cd, Pt and mixtures thereof. The metal of the catalyst layer 104a reacts with the amorphous silicon of the amorphous silicon layer to form a metal silicide which is then used to induce crystallization. Accordingly, crystallization of the amorphous silicon layer comprises a first process by which a metal catalyst is used to form a metal silicide, and a second process by which the metal silicide is used to induce crystallization. Both such processes are performed at temperatures greater than about 500° C.

The joule heat layer 104b generates heat having temperatures greater than the temperatures at which the crystallization processes are performed. This heat is generated by application of electric power to the joule heat layer 104b. In other words, the joule heat layer acts as a thin film heater, generating heat through electricity. The joule heat layer may comprise a conductive metal having a predetermined resistance. In one embodiment, for example, the joule heat layer comprises a metal that does not oxidize, even at high temperatures, has an appropriate resistance and has excellent heat conductivity. Nonlimiting examples of suitable metals for use in the joule heat layer include Pt, Au and mixtures thereof.

Figure 6A:
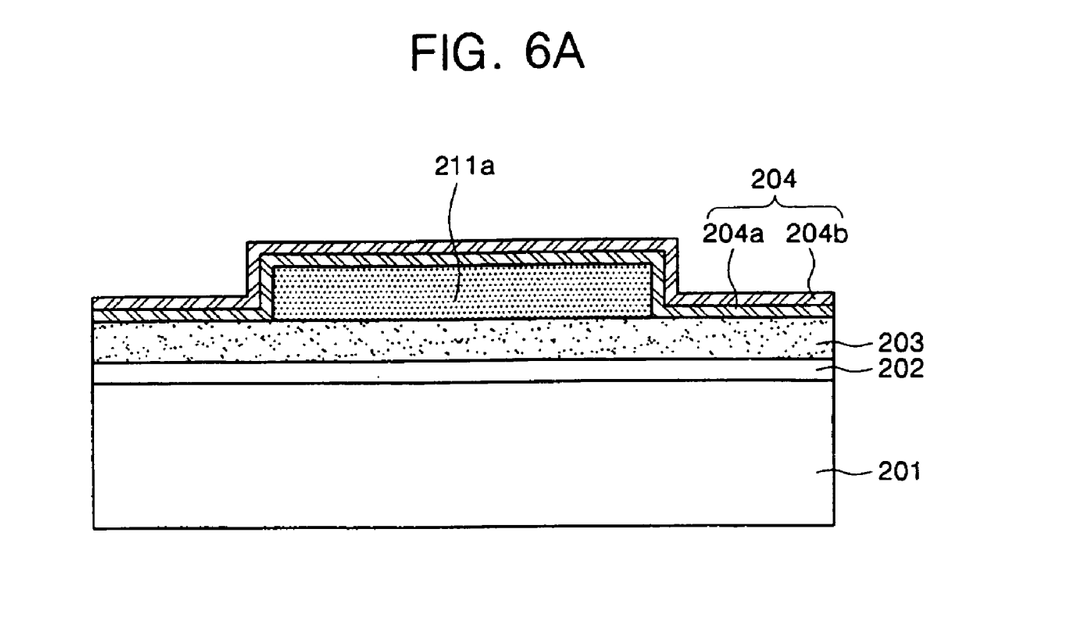
FIG. 6A is a cross-sectional view of a substrate, illustrating one step in an alternative method of fabricating a thin film transistor according to the present invention.

In an alternative embodiment, as shown in FIG. 6A, a photoresist layer 211a may first be deposited on a region of the amorphous silicon layer 203 on which the catalyst construction 204 is not to be positioned. The catalyst layer 204a and joule heat layer 204b are positioned over the entire substrate, including the region containing the photoresist layer 211a. The photoresist layer 211a and the regions of the catalyst layer 204a and joule heat layer 204b positioned over the photoresist layer 211a are then removed.

Figure 6B:
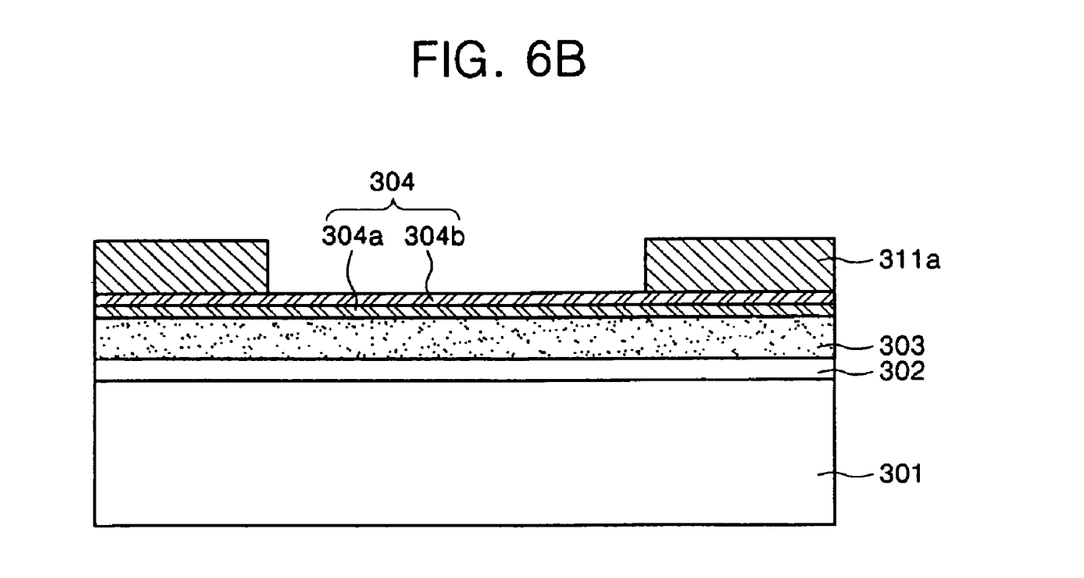
FIG. 6B is a cross-sectional view of a substrate, illustrating one step in another alternative method of fabricating a thin film transistor according to the present invention.

In another alternative embodiment, as shown in FIG. 6B, the catalyst layer 304a and joule heat layer 304b cover the entire surface of the amorphous silicon layer 303. A photoresist layer 311b is then positioned on at least one region of the catalyst construction 304. The photoresist layer 311a and the regions of the catalyst layer 204a and joule heat layer 204b on which the photoresist layer 311a is positioned, are then removed.

Figure 3A:
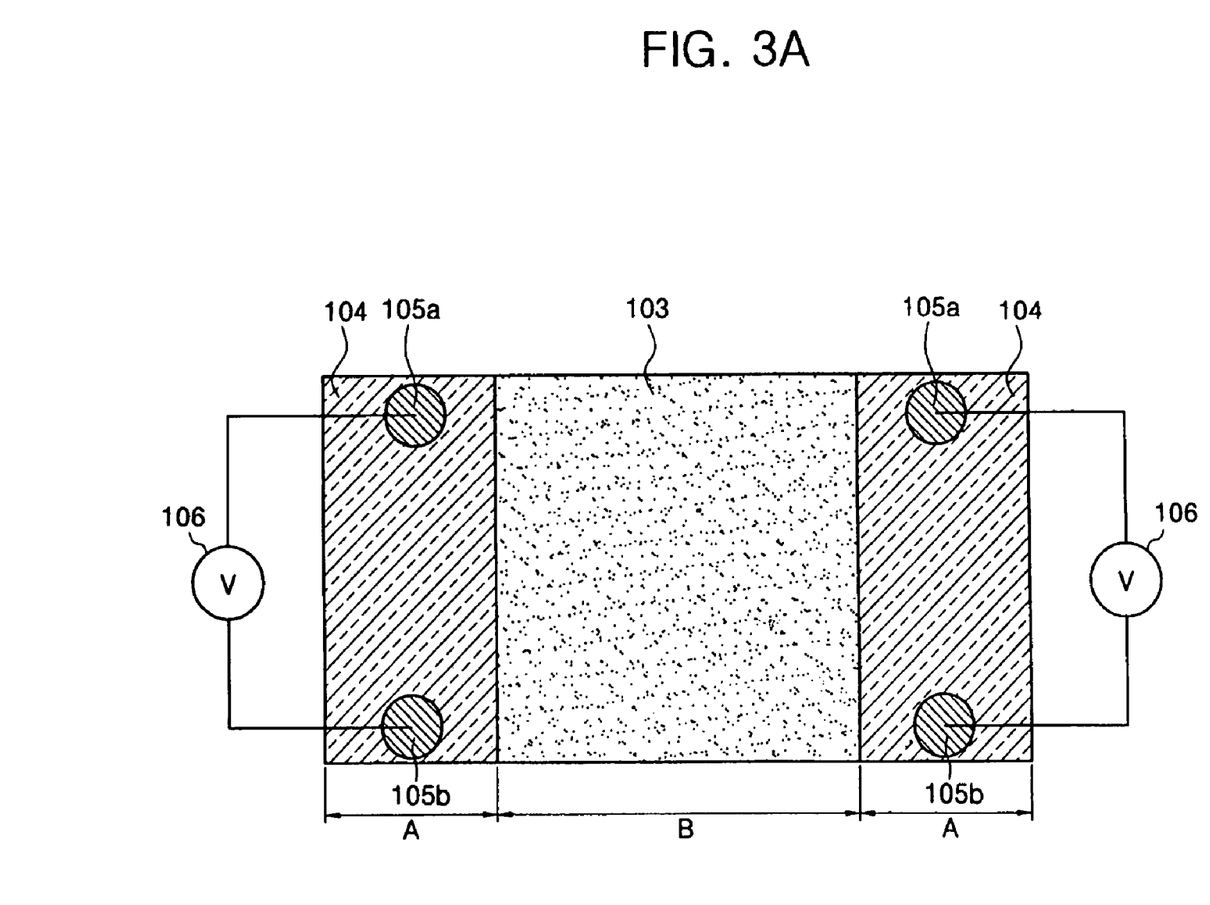
FIG. 3A is a schematic plan view of the substrate of FIG. 2, illustrating a third step in the method of fabricating a thin film transistor.

FIGS. 3A through 4B illustrate various steps in a process of connecting the catalyst construction 104 to an electrical power source, and applying electrical power to the catalyst construction 104 to crystallize the amorphous silicon layer. As shown in FIGS. 3A, at least one anode 105a and at least one cathode 105b are positioned on opposite ends of the catalyst construction 104. An electric power source 106 is connected to the anode 105a and cathode 105b.

In the depicted embodiment, the catalyst construction 104 is positioned on first and second regions A of the substrate. The first and second regions A are located at opposite ends of the substrate and are separated from each other by a predetermined distance. In this configuration, each of the first and second regions A containing the catalyst construction 104 comprise an anode and cathode on opposite ends of the region, as shown in FIG. 3A.

After connection of the power supply 106 to the anode 105a and cathode 105b, electrical power is delivered from the power source to the catalyst construction 104 through the anode 105a and cathode 105b. The electric power applied to the catalyst construction 104 generates joule heat by resistance of the catalyst construction 104. In particular, the joule heat is generated primarily in the joule heat layer.

The generated joule heat is proportional to the applied electric power as shown in the following Formula 1:

$$\text{Joule heat} \propto \text{power } W = \text{voltage } (V) \times \text{current } (A) \quad (1)$$

Figure 3B:
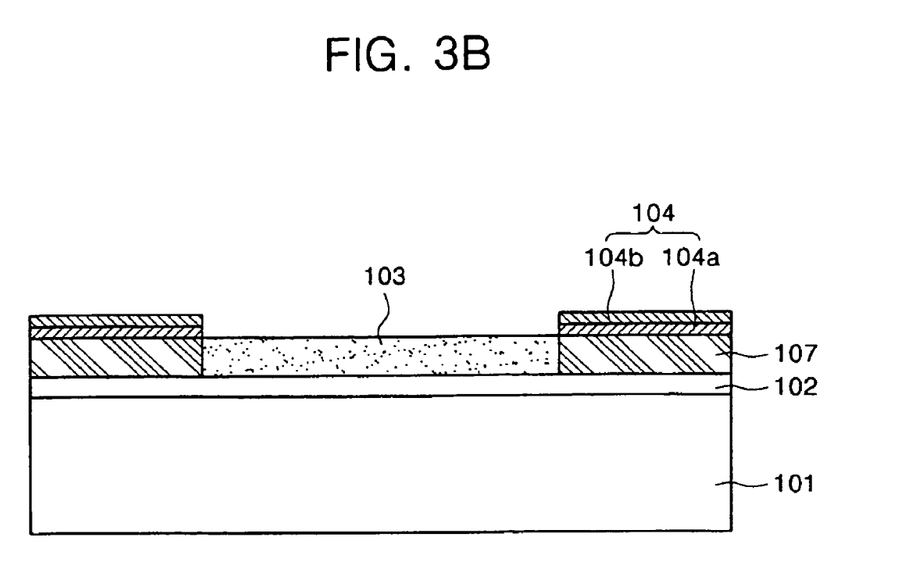
FIG. 3B is a cross-sectional view of the substrate of FIG. 3A.
Figure 4A:
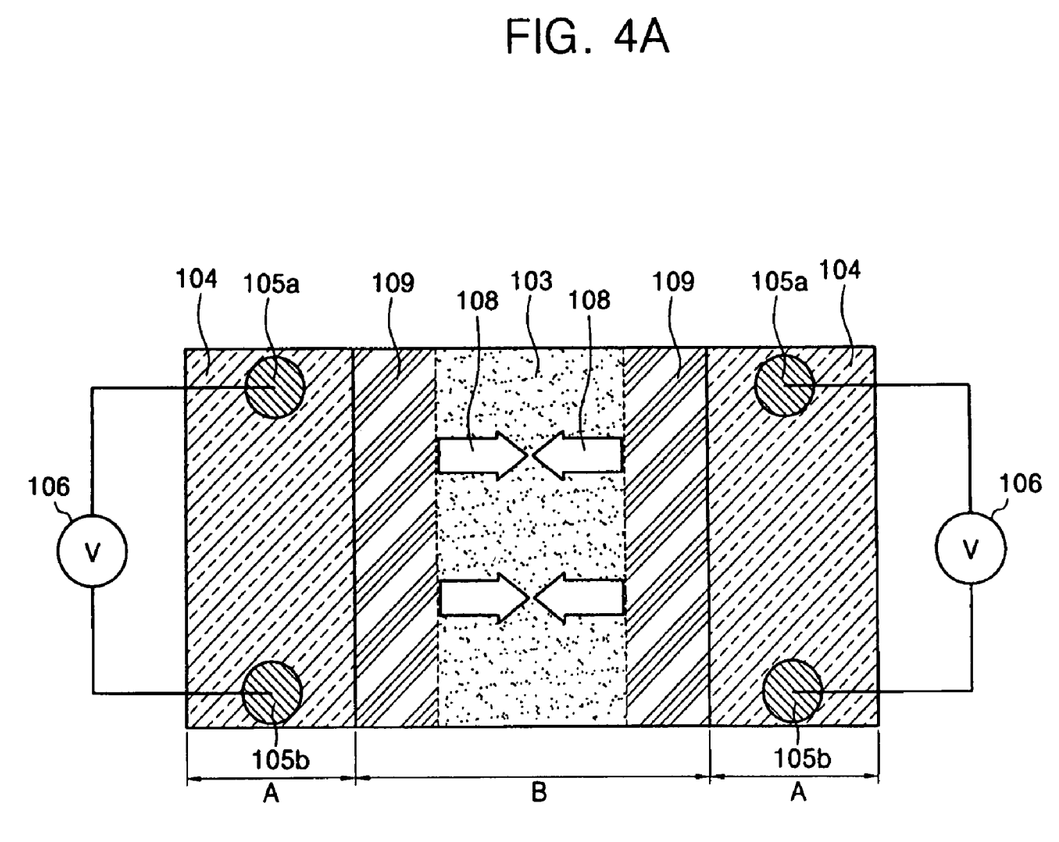
FIG. 4A is a schematic plan view of the substrate of FIG. 3B, illustrating a fourth step in the method of fabricating a thin film transistor.
Figure 4B:
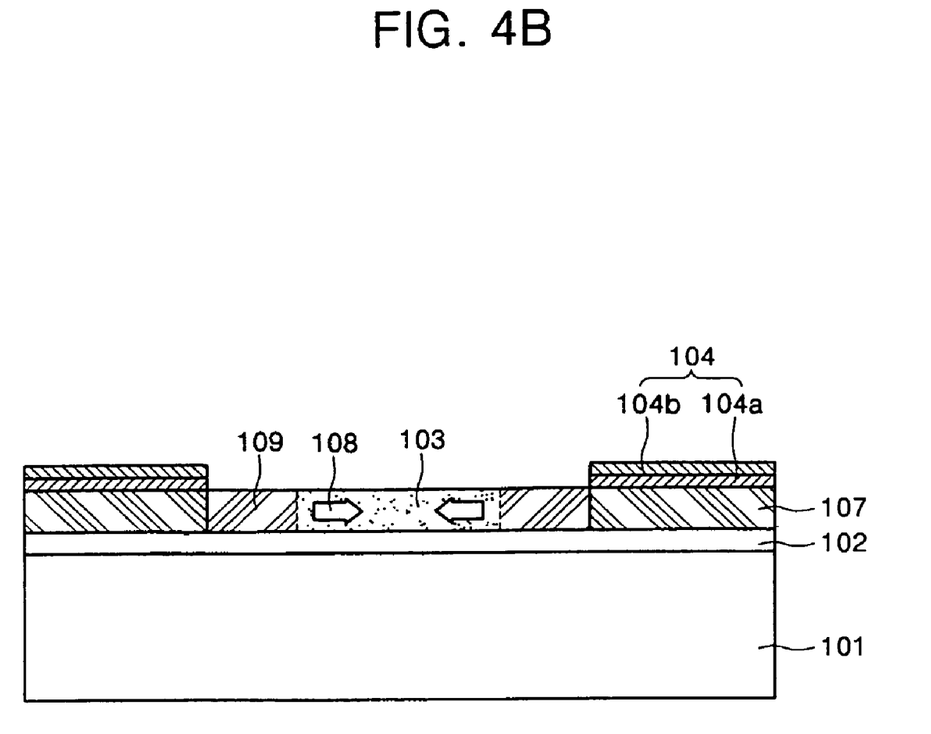
FIG. 4B is a cross-sectional view of the substrate of FIG. 4A.

The generated joule heat is then conducted to the first and second regions A of the amorphous silicon layer, located below the catalyst construction 104. The conducted joule heat is linearly proportional to the applied electric power as shown in Formula 1 above. The conducted joule heat heats the regions A of the amorphous silicon layer, raising the temperature of the amorphous silicon layer to about 800 to about 1,000° C. over a period of several seconds to tens of seconds. After heating, the metal of the metal catalyst layer crystallizes the first and second regions A of the amorphous silicon layer to form a polysilicon layer 107. At this point, the third region B of the amorphous silicon layer, on which the catalyst construction is not positioned, is not yet crystallized.

After crystallization of regions A of the amorphous silicon layer, electric power is continually delivered to the catalyst construction. The third region B of the amorphous silicon layer is crystallized by propagating the crystallization of regions A toward the third region B by metal induced lateral crystallization (MILC), shown by arrows 108 in FIGS. 4A and 4B. This crystallization process creates a polysilicon layer 109. Crystallization of the third region B depends on the electric power delivered to the catalyst construction, the joule heat generated during power delivery and the distance of the region from the catalyst construction. Therefore, the crystallization of the third region B of the amorphous silicon layer is controlled by controlling the joule heat generated in the catalyst construction, and more particularly, the joule heat generated in the joule heat layer.

Figure 7:
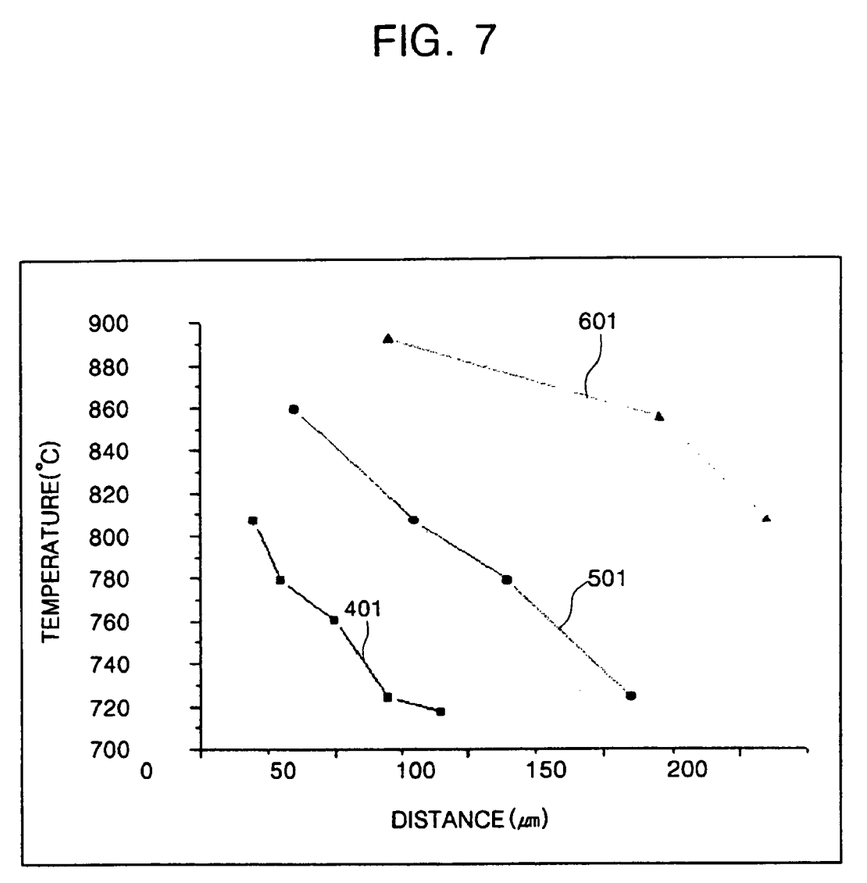
FIG. 7 is a graph of the relationship of the temperature of a region and the distance of the region from a catalyst construction of different substrates exposed to various power outputs.
Figure 8A:
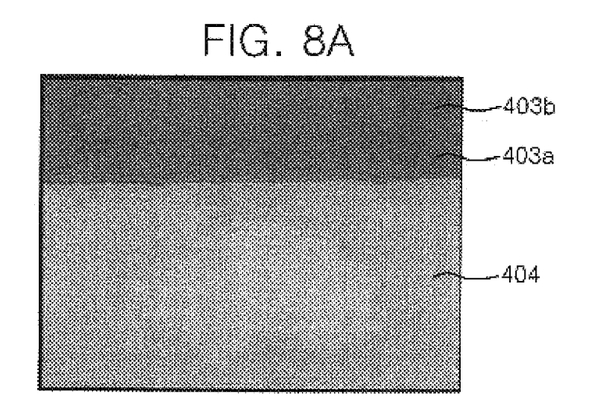
FIG. 8A is a photograph illustrating the degree to which an amorphous silicon layer crystallized after application of 7.4 W of electric power.
Figure 8B:
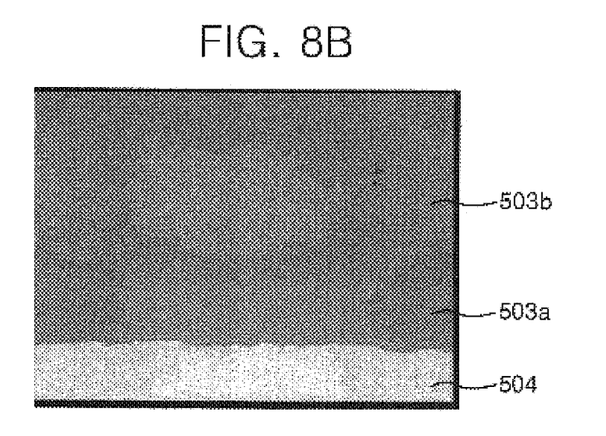
FIG. 8B is a photograph illustrating the degree to which an amorphous silicon layer crystallized after application of 8.6 W of electric power.
Figure 8C:
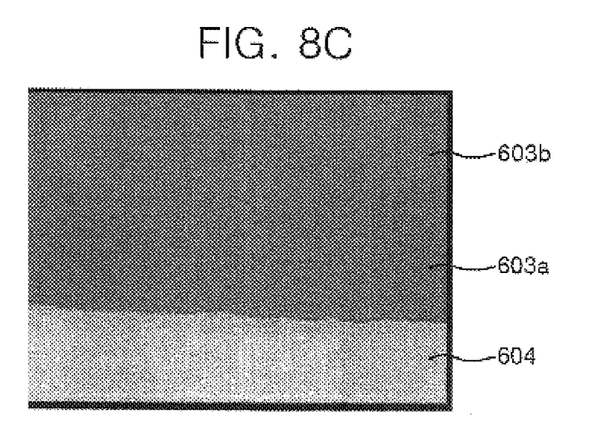
FIG. 8C is a photograph illustrating the degree to which an amorphous silicon layer crystallized after application of 9.5 W of electric power.
Figure 9:
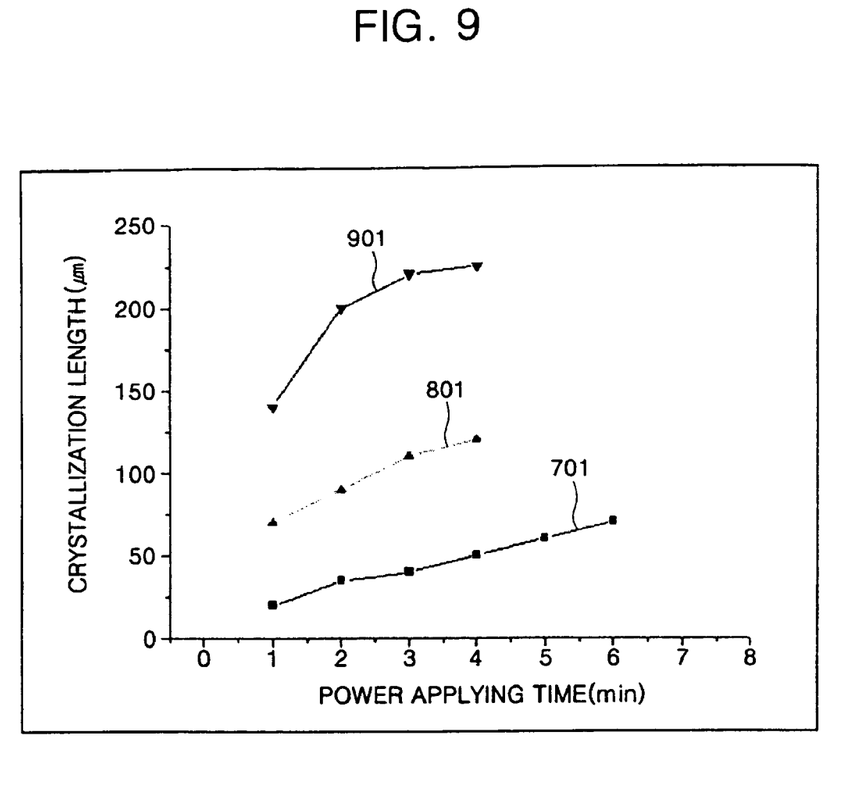
FIG. 9 is a graph of the relationship of the length of crystallization to the length of time of exposure to electric power of different substrates exposed to various power outputs.
Figure 10:
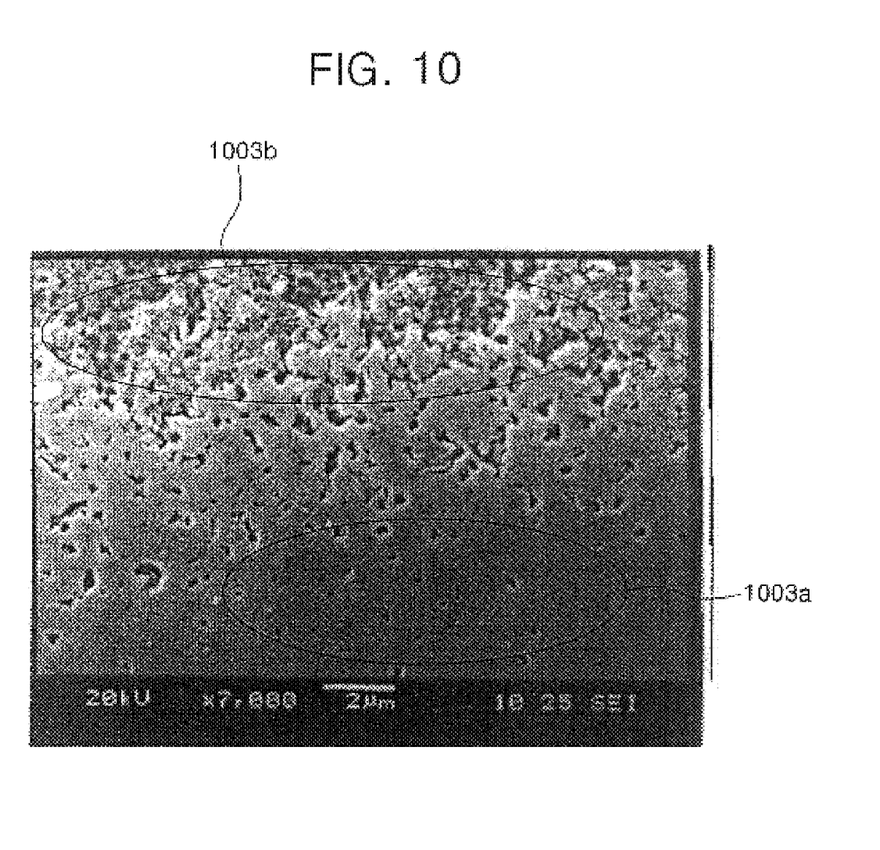
FIG. 10 is a photograph illustrating a crystallized polysilicon layer.

FIG. 7 is a graph of the relationship of the temperature of the third region to the distance of the third region from the catalyst construction of different substrates exposed to various power outputs. Specifically, FIG. 7 compares the relationship of temperature and distance of a first substrate 401 exposed to 7.4 W, a second substrate 501 exposed to 8.6 W, and a third substrate 601 exposed to 9.5 W. Each substrate 401, 501 and 601 was exposed to its respective power output for about one minute. FIG. 8A is a photograph illustrating the degree of crystallization of the amorphous silicon layer of the first substrate 401. FIG. 8B is a photograph illustrating the degree of crystallization of the amorphous silicon layer of the second substrate 501. FIG. 8C is a photograph illustrating the degree of crystallization of the amorphous silicon layer of the third substrate 601. FIG. 9 is graph of the relationship of crystallization length to the length of time of exposure to electric power of the substrates of FIG. 7. Namely, FIG. 9 compares the relationship of crystallization length to time of exposure of the first substrate 401 exposed to 7.4 W, the second substrate 501 exposed to 8.6 W, and the third substrate 601 exposed to 9.5 W. FIG. 10 is a photograph of an amorphous silicon layer crystallized to a polysilicon layer by lateral propagation.

As noted above, FIG. 7 compares the relationship of temperature and distance of a first substrate 401 exposed to 7.4 W, a second substrate 501 exposed to 8.6 W, and a third substrate 601 exposed to 9.5 W. As shown in FIG. 7, the temperature is higher at higher power output levels. Also, the temperature is higher at distances closer to the catalyst construction. Therefore, the temperature of the amorphous silicon layer can be controlled by controlling the applied electric power. By controlling the temperature of the amorphous silicon layer, crystallization of the third region can also be controlled.

As also noted above, FIG. 8A is a photograph illustrating the degree of crystallization of the amorphous silicon layer of the first substrate 401, FIG. 8B is a photograph illustrating the degree of crystallization of the amorphous silicon layer of the second substrate 501, and FIG. 8C is a photograph illustrating the degree of crystallization of the amorphous silicon layer of the third substrate 601. As shown in FIG. 8A, the substrate 401 comprises a catalyst construction 404, a crystallized region 403a crystallized by lateral propagation, and an amorphous region 403b which is not crystallized. Similarly, as shown in FIG. 8B, the substrate 501 comprises a catalyst construction 504, a crystallized region 503a crystallized by lateral propagation, and an amorphous region 503b which is not crystallized Also, as shown in FIG. 8C, the substrate 601 comprises a catalyst construction 604, a crystallized region 603a crystallized by lateral propagation, and an amorphous region 603b which is not crystallized. As shown in FIGS. 8A through 8C, the crystallized regions 403a, 503a and 603a grow larger with higher applied voltages.

FIG. 9 is a graph of the relationship of the degree of crystallization (i.e. the length of the crystallized polysilicon layer) of the second region to the length of time the electric power is delivered of a first substrate 701 exposed to 7.4 W, a second substrate 801 exposed to 8.6 W, and a third substrate 901 exposed to 9.5 W. As shown in FIG. 9, given the same exposure time, the length of crystallization increases as the applied electric power increases. In particular, the degree of crystallization (i.e. the crystallization gradient) increases as the applied electric power increases.

FIG. 10 is a photograph of the second region of an amorphous silicon layer crystallized to a polysilicon layer by lateral propagation. As shown in FIG. 10, the second region comprises a crystallized region 1003a, and an amorphous region 1003b which is not crystallized. FIG. 10 shows that the second region is crystallized from an amorphous silicon layer to a polysilicon layer by metal induced lateral crystallization (MILC).

Figure 5A:
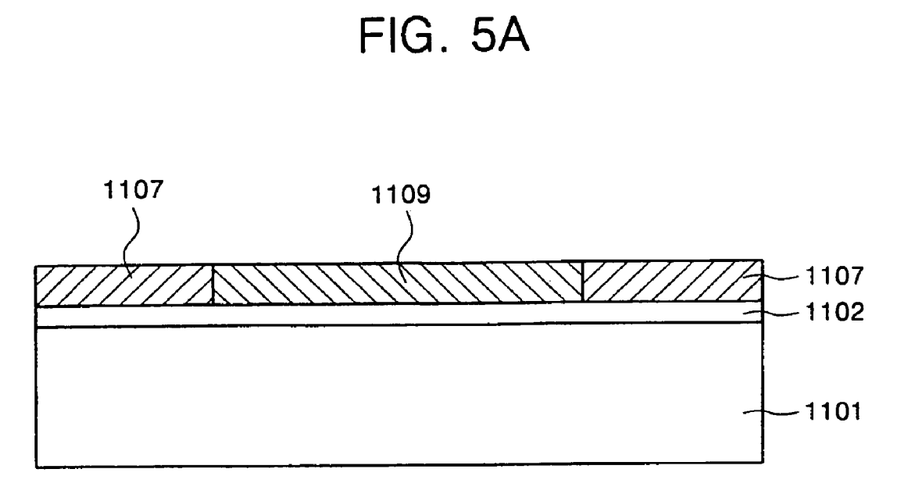
FIG. 5A is a cross-sectional view of the substrate of FIG. 4B, illustrating a fifth step in the method of fabricating a thin film transistor.
Figure 5B:
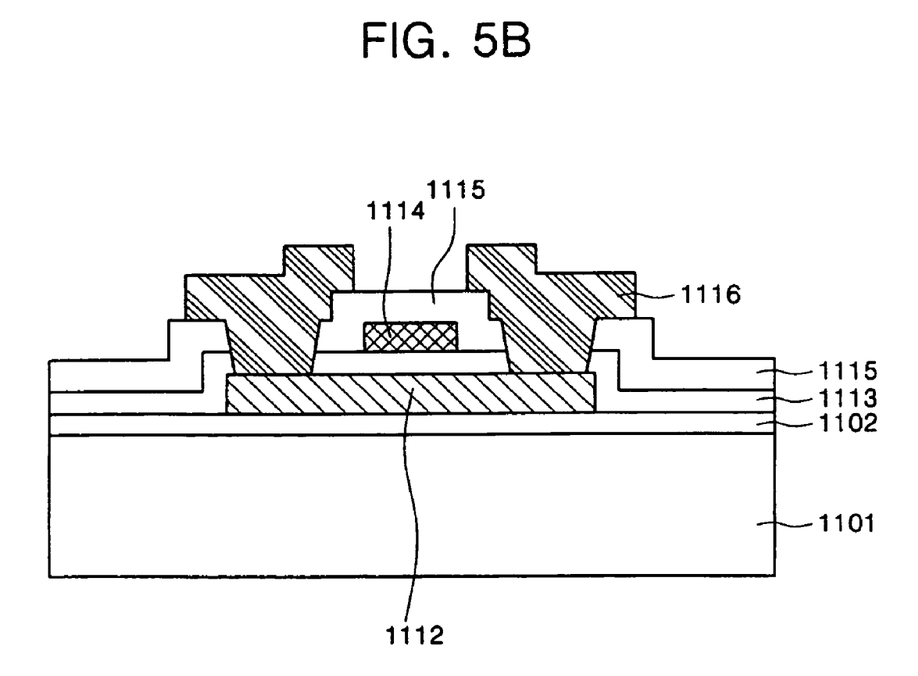
FIG. 5B is a cross-sectional view of the substrate of FIG. 5A, illustrating a sixth step in the method of fabricating a thin film transistor.

FIGS. 5A and 5B illustrate various steps in a process for fabricating a TFT using the polysilicon layer crystallized as described above. As shown in FIG. 5A, after crystallization, the catalyst construction, which comprises the catalyst layer and the joule heat layer, is removed, leaving a polysilicon layer having a portion 1107 crystallized by metal induced crystallization, and a portion 1109 crystallized by MILC.

Then, as shown in FIG. 5B, the polysilicon layer is patterned to form a semiconductor layer 1112. A gate insulating layer 1113, which comprises a single layer or multiple layers is formed over the entire surface of the substrate. The gate insulating layer may comprise any suitable material. Nonlimiting examples of suitable materials for the gate insulating layer 1113 include silicon oxide, silicon nitride and mixtures thereof. A gate electrode 1114 is positioned on the gate insulating layer 1113.

An interlayer insulating layer 1115 is positioned over the entire surface of the substrate, and the interlayer insulating layer 1115 and gate insulating layer 1113 are then etched to form openings in the layers 1115 and 1113 which expose portions of the semiconductor layer 1112. A source/drain electrode layer is deposited over the entire surface of the substrate and then patterned to form source/drain electrodes 1116 in the openings created by etching the interlayer insulating layer 1115 and gate insulating layer 1113, thereby forming a TFT.

As described above, according to the inventive methods of fabricating a TFT, the portion of an amorphous silicon layer on which a catalyst construction is positioned is crystallized by joule heat generated by the application of electric power to the catalyst construction. Crystallization is then propagated to the remaining portion of the amorphous silicon layer, thereby rapidly crystallizing the entire amorphous silicon layer.

Exemplary embodiments of the present invention have been described for illustrative purposes. However, those skilled in the art will appreciate that various modifications, additions and substitutions can be made without departing from the scope and spirit of the invention as disclosed in the accompanying claims.

What is claimed is:

1. A method of fabricating a thin film transistor comprising:
   preparing an insulative substrate;
   forming an amorphous silicon layer on the insulative substrate;
   forming a catalyst construction on at least a portion of the amorphous silicon layer;
   connecting at least one anode and at least one cathode to the catalyst construction;
   delivering a predetermined amount of electric power to the anode and the cathode, wherein the delivered electric power generates joule heat in the catalyst construction, and wherein the generated joule heat heats the amorphous silicon layer to a temperature rangina from about 800 to about 1,000° C.;
   crystallizing the portion of the amorphous silicon layer on which the catalyst construction is positioned using the generated joule heat; and
   crystallizing a remaining portion of the amorphous silicon layer by propagating the crystallization of the portion of the amorphous silicon layer on which the catalyst construction is positioned, thereby forming a crystallized polysilicon layer.

2. The method of claim 1, further comprising:
   removing the catalyst construction after formation of the crystallized polysilicon layer; and
   patterning the polysilicon layer to form a semiconductor layer.

3. The method according to claim 2, further comprising:
   positioning a gate insulating layer over an entire surface of the substrate;
   positioning a gate electrode on the gate insulating layer;
   positioning an interlayer insulating layer on the entire surface of the substrate;
   etching the interlayer insulating layer and the gate insulating layer to form openings;
   depositing a source/drain electrode layer on the entire surface of the substrate; and
   patterning the source/drain electrode layer to form source/drain electrodes.

4. The method of claim 1, wherein forming the catalyst construction comprises:
   forming a photoresist layer on a portion of the amorphous silicon layer;
   forming a catalyst layer over an entire surface of the amorphous silicon layer;
   forming a joule heat layer over the entire surface of the amorphous silicon layer; and
   removing the photoresist layer and the portions of the catalyst layer and the joule heat layer covering the photoresist layer, thereby forming the catalyst construction on a portion of the amorphous silicon layer.

5. The method of claim 4, wherein the catalyst layer comprises a metal selected from the group consisting of Ni, Pd, Ti, Ag, Au, Al, Sn, Sb, Cu, Co, Mo, Tr, Ru, Rh, Cd, Pt and mixtures thereof.

6. The method of claim 4, wherein the catalyst layer has a thickness of about 10 to about 100 Å.

7. The method of claim 4, wherein the joule heat layer comprises a metal selected from the group consisting of Pt, Au and mixtures thereof.

8. The method of claim 1, wherein forming the catalyst construction comprises:
   forming a catalyst layer over an entire surface of the amorphous silicon layer;
   forming a joule heat layer over the entire surface of the amorphous silicon layer; and
   patterning the catalyst layer and the joule heat layer, thereby forming the catalyst construction.

9. The method of claim 8, wherein the catalyst layer comprises a metal selected from the group consisting of Ni, Pd, Ti, Ag, Au, Al, Sn, Sb, Cu, Co, Mo, Tr, Ru, Rh, Cd, Pt and mixtures thereof.

10. The method of claim 8, wherein the catalyst layer has a thickness of about 10 to about 100 Å.

11. The method of claim 8, wherein the joule heat layer comprises a metal selected from the group consisting of Pt, Au and mixtures thereof.

12. The method of claim 1, wherein the generated joule heat is linearly proportional to the delivered electric power.

13. The method of claim 4, wherein the joule heat is generated in the joule heat layer.

14. The method according to claim 8, wherein the joule heat is generated in the joule heat layer.

15. The method of claim 1, wherein the length of crystallization of the polysiliconi-layer- is proportional to the delivered electric power.

16. The method of claim 1, wherein the length of crystallization of the polysilicon layer is proportional to the length of time the polysilicon layer is exposed to the electric power.

17. The method of claim 1, wherein a temperature of a region of the amorphous silicon layer is reversely proportional to a distance of the region from the catalyst construction.

18. The method of claim 1, wherein a temperature of a region of the amorphous silicon layer is proportional to the delivered electric power.

19. A method of fabricating a thin film transistor comprising:
   preparing an insulative substrate;
   forming an amorphous silicon layer on the insulative substrate;
   forming a catalyst construction on at least a portion of the amorphous silicon layer;
   connecting at least one anode and at least one cathode to the catalyst construction;
   delivering a predetermined amount of electric power to the anode and the cathode, wherein the delivered electric power generates joule heat in the catalyst construction ,and wherein the generated joule heat heats the amorphous silicon layer to a temperature ranging from about 800 to about 1,000° C.;
   crystallizing the portion of the amorphous silicon layer on which the catalyst construction is positioned using the generated joule heat;
   crystallizing a remaining portion of the amorphous silicon layer by propagating the crystallization of the portion of the amorphous silicon layer on which the catalyst construction is
   positioned, thereby forming a crystallized polysilicon layer;
   positioning a gate insulating layer over an entire surface of the substrate;
   positioning a gate electrode on the gate insulating layer;
   positioning an interlayer insulating layer on the entire surface of the substrate;
   etching the interlayer insulating layer and the gate insulating layer to form openings;
   depositing a source/drain electrode layer on the entire surface of the substrate; and
   patterning the source/drain electrode layer to form source/drain electrodes.

* * * * *

UNITED STATES PATENT AND TRADEMARK OFFICE
CERTIFICATE OF CORRECTION

PATENT NO.         : 7,253,037 B2                                    Page 1 of 1
APPLICATION NO. : 11/206923
DATED              : August 7, 2007
INVENTOR(S)        : In-Young Jung It is certified that error appears in the above-identified patent and that said Letters Patent is hereby corrected as shown below:

<u>In the Claims</u>

Column 7, line 15, Claim 1          Delete "rangina",
                                    Insert --ranging--

Column 8, line 19, Claim 15         Delete "polysiliconi-layer",
                                    Insert --polysilicon layer--

Signed and Sealed this

Twenty-eighth Day of October, 2008

JON W. DUDAS
*Director of the United States Patent and Trademark Office*